(12) United States Patent
Horiguchi et al.

(10) Patent No.: US 6,402,848 B1
(45) Date of Patent: Jun. 11, 2002

(54) SINGLE-SUBSTRATE-TREATING APPARATUS FOR SEMICONDUCTOR PROCESSING SYSTEM

(75) Inventors: Takahiro Horiguchi, Tama; Wataru Okase, Sagamihara; Eiichiro Takanabe, Tsukui-gun, all of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/549,343

(22) Filed: Apr. 13, 2000

(30) Foreign Application Priority Data

Apr. 23, 1999 (JP) .......................... 11-117245
Jul. 22, 1999 (JP) .......................... 11-207327

(51) Int. Cl.$^7$ ............................................. C23C 16/00
(52) U.S. Cl. ...................................... 118/715; 156/345
(58) Field of Search ................... 118/715, 724, 118/726; 156/345

(56) References Cited

U.S. PATENT DOCUMENTS

| | | | | |
|---|---|---|---|---|
| 5,148,714 A | * | 9/1992 | McDiarmid | 118/730 |
| 5,628,829 A | * | 5/1997 | Foster | 118/730 |
| 5,763,856 A | * | 6/1998 | Ohkase | 118/725 |
| 5,834,371 A | * | 11/1998 | Ameen | 438/656 |
| 5,871,586 A | * | 2/1999 | Crawley | 118/715 |
| 6,063,199 A | * | 5/2000 | Sajoto | 118/715 |
| 6,280,793 B1 | * | 8/2001 | Atwell | 118/726 |
| 6,300,600 B1 | * | 10/2001 | Ratliff | 118/724 |

FOREIGN PATENT DOCUMENTS

| | | | | |
|---|---|---|---|---|
| JP | 62-199019 | * | 9/1987 | 118/715 |
| JP | 63-56914 | * | 3/1988 | 118/715 |
| JP | 1-251710 | * | 10/1989 | 118/724 |
| JP | 9-167762 | | 6/1997 | |

* cited by examiner

Primary Examiner—Richard Bueker
(74) Attorney, Agent, or Firm—Oblon, Spivak, McClelland, Maier & Neustadt, P.C.

(57) ABSTRACT

In an annealing apparatus for processing semiconductor wafers one by one, a hermetic process chamber has a work table having an upper surface on which a wafer is placed. A shower head is disposed to supply a process gas into the process chamber from a position opposing the upper surface of the work table. An exhaust chamber is connected to the bottom portion of the process chamber through an inlet opening below the work table. The inlet opening has a planar contour smaller than that of the work table. The planar contours of the work table and the opening are arranged almost concentrically with each other. An exhaust mechanism is connected to the exhaust chamber, so the process chamber is exhausted through the exhaust chamber.

11 Claims, 8 Drawing Sheets

SINGLE-SUBSTRATE-TREATING APPARATUS FOR SEMICONDUCTOR PROCESSING SYSTEM

CROSS-REFERENCE TO RELATED APPLICATIONS

This application is based upon and claims the benefit of priority from the prior Japanese Patent Applications No. 11-117245, filed Apr. 23, 1999; and No. 11-207327, filed Jul. 22, 1999, the entire contents of which are incorporated herein by reference.

BACKGROUND OF THE INVENTION

The present invention relates to a single-substrate-treating apparatus for a semiconductor processing system, which performs processing such as film formation or annealing of target substrates such as semiconductor wafers one by one. Semiconductor processing means herein various processes executed to manufacture a semiconductor device on a target substrate such as a semiconductor wafer or LCD substrate by forming a predetermined pattern of a semiconductor layer, insulating layer, and conductive layer on the target substrate, or a structure including interconnections and electrodes connected to the semiconductor device.

In manufacturing a semiconductor integrated circuit, a target substrate such as a semiconductor wafer is repeatedly subjected to various processes including film formation, etching, oxidation/diffusion, and annealing/modification. In these processes, a process gas necessary in correspondence with the type of process is introduced into a process chamber. For example, a film formation gas is supplied for film formation, and ozone gas is supplied for annealing/modifying.

The process chamber is evacuated to maintain predetermined pressure preferable to the type of process. A gas flow generated upon evacuation is required to be uniform with respect to the surface of the semiconductor wafer for the purpose of maintaining high planar uniformity of the process.

A conventional general single-substrate-treating apparatus for a semiconductor processing system will be described. FIG. 6 is a schematic view showing a conventional general annealing/modifying apparatus. FIG. 7 is a sectional view taken along a line VII—VII in FIG. 6.

As shown in FIG. 6, this annealing/modifying apparatus has a closed process chamber 2 made of aluminum and having, e.g., a rectangular section. In the process chamber 2, a work table 6 stands upright on the bottom portion of the process chamber through a strut 4. The work table 6 incorporates a heater 8 to heat a target substrate or a semiconductor wafer W placed on the surface of the work table 6. A ring-shaped shower head 10 formed from quartz is disposed above the work table 6 to introduce a process gas, e.g., ozone into the process chamber 2. The process chamber 2 has a transparent window 12 at its ceiling. The wafer surface is irradiated with ultraviolet rays UV emitted from an external UV lamp 14.

On a bottom portion 16 of the process chamber 2, four exhaust ports 18 (FIG. 7) are formed at positions obliquely under the work table 6. An exhaust tube 20 is connected to each exhaust port 18. The exhaust tubes 20 join each other on the downstream side and are connected to a vacuum pump (not shown) for evacuating the process chamber 2.

In this annealing/modifying apparatus, the wafer W on the work table 6 is heated and simultaneously affected by ozone gas excited by the ultraviolet rays UV. With this process, for example, a $Ta_{Ox}$ (tantalum oxide) film formed on the surface of the wafer W is annealed and modified.

In this apparatus, the planar uniformity of processing may not be maintained sufficiently high. This problem is becoming conspicuous as the semiconductor wafer size increases from 6 or 8 inches to 12 inches. Additionally, in the above apparatus, the target substrate or a thin film thereof may be contaminated by particles of a metal or by-product.

BRIEF SUMMARY OF THE INVENTION

It is an object of the present invention to provide a single-substrate-treating apparatus for a semiconductor processing system, which can maintain high planar uniformity of processing.

It is another object of the present invention to provide a single-substrate-treating apparatus for a semiconductor processing system, which rarely contaminates a target substrate with particles of a metal or by-product.

According to the present invention, there is provided a single-substrate-treating apparatus for a semiconductor processing system, comprising:

a hermetic process chamber;

a work table disposed in the process chamber and having an upper surface on which a target substrate is placed;

a supply mechanism for supplying a process gas into the process chamber from a position opposing the upper surface of the work table;

an exhaust chamber connected to a bottom portion of the process chamber through a first opening below the work table, the first opening having a planar contour smaller than that of the work table, and the planar contours of the work table and the first opening being arranged substantially concentrically with each other; and an exhaust mechanism for exhausting the process chamber through the exhaust chamber and the first opening.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

In the process of developing the present invention, the present inventors have studied the reasons why sufficiently high planar uniformity of processing cannot be maintained in the conventional single-substrate-treating apparatus described with reference to FIG. 6. As a consequence, the present inventors have obtained the following findings.

Figure 6:
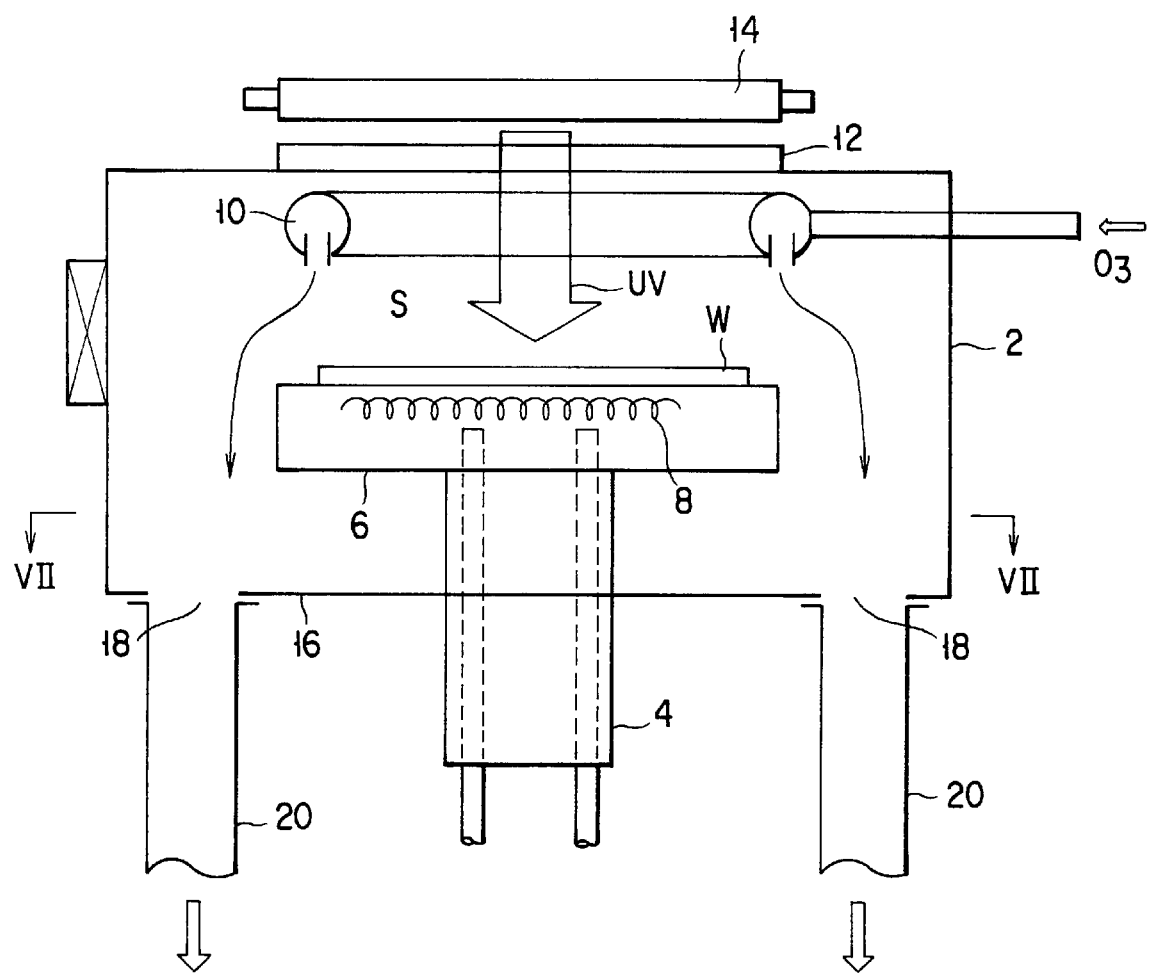
FIG. 6 is a schematic view showing a conventional annealing/modifying apparatus.

In the apparatus shown in FIG. 6, a process gas such as ozone introduced into the process chamber 2 flows downward through a process space S and then flows on the surface of the wafer W outward in the radial direction. Next, the process gas is almost uniformly exhausted from the four exhaust ports 18 arranged at positions obliquely under the work table 6.

Detailed examination of the actual process gas flow in the process space S reveals that the gas does not uniformly flow outward in the radial direction of the wafer W. The gas flows in considerably different ways in a direction wherein the exhaust port 18 is present and in a direction wherein no exhaust port 18 is present. One of the main reasons why the high planar uniformity of processing on the wafer surface cannot be maintained is this offset in the gas flow.

Figure 7:
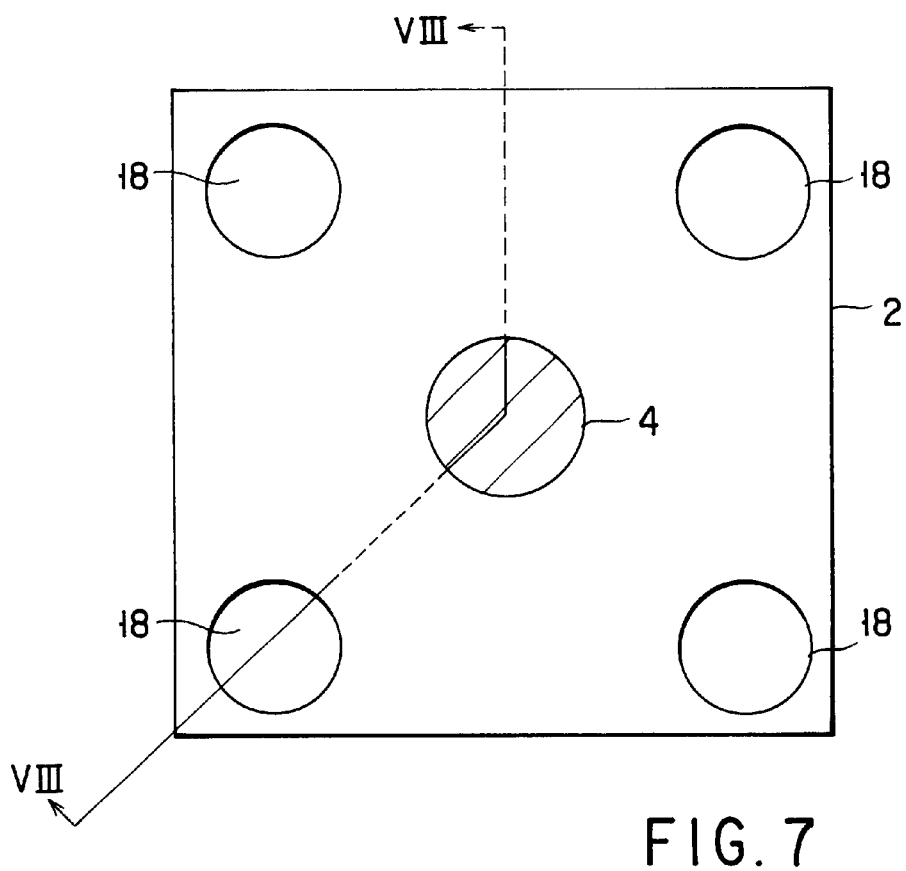
FIG. 7 is a sectional view taken along a line VII—VII in FIG. 6.
Figure 8:
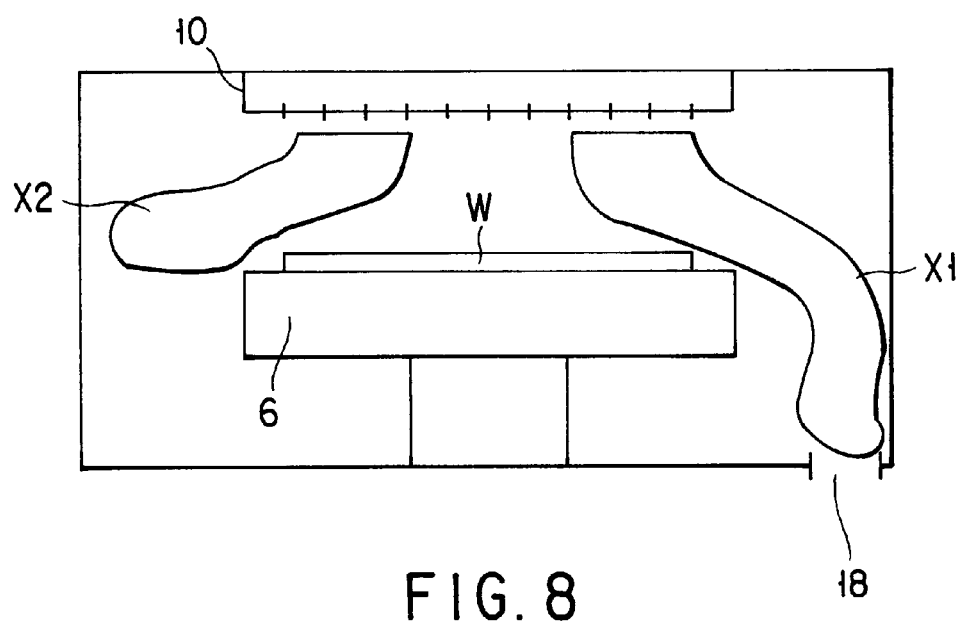
FIG. 8 is a view showing a simulation result of the gas flow in a section taken along a line VIII—VIII in FIG. 7.

FIG. 8 is a view showing a simulation result of the gas flow in a section taken along a line VIII—VIII in FIG. 7. As shown in FIG. 8, in a direction X1 wherein the exhaust port 18 is present, the process gas smoothly flows. However, in a direction X2 wherein no exhaust port 18 is present, the process gas slightly stays.

To prevent this nonuniformity of the gas flow, a larger number of exhaust ports 18 may be arrayed on a circumference. However, this arrangement cannot be employed because the exhaust structure becomes complex, and a number of exhaust tubes are large obstacles for maintenance.

Embodiments of the present invention constructed on the basis of the above findings will be described below with reference to the accompanying drawing. The same reference numerals denote the same constituent elements throughout the drawing, and a detailed description thereof will be repeated only if it is necessary.

Figure 1:
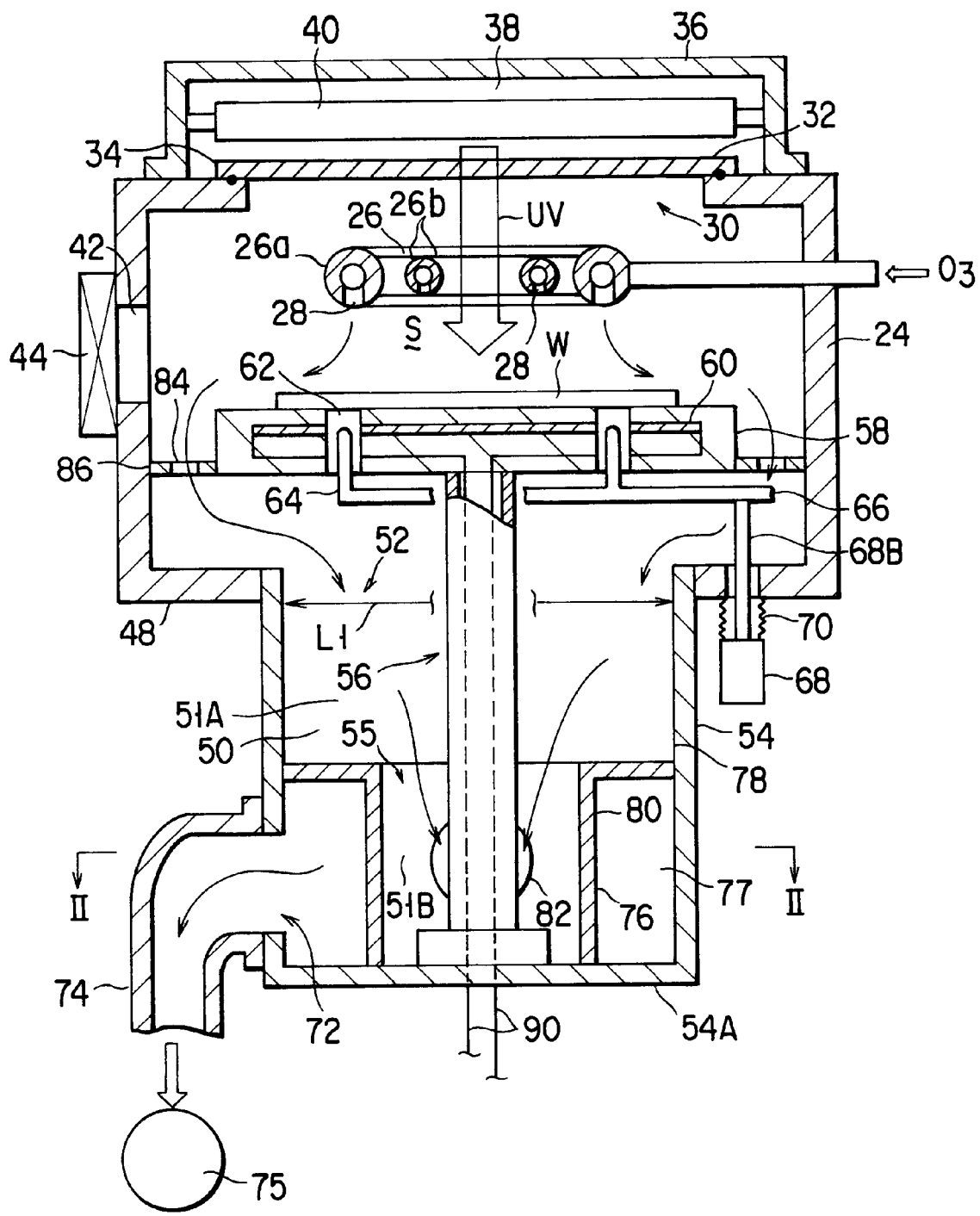
FIG. 1 is a sectional view showing a single-substrate-treating annealing/modifying apparatus according to an embodiment of the present invention.
Figure 2:
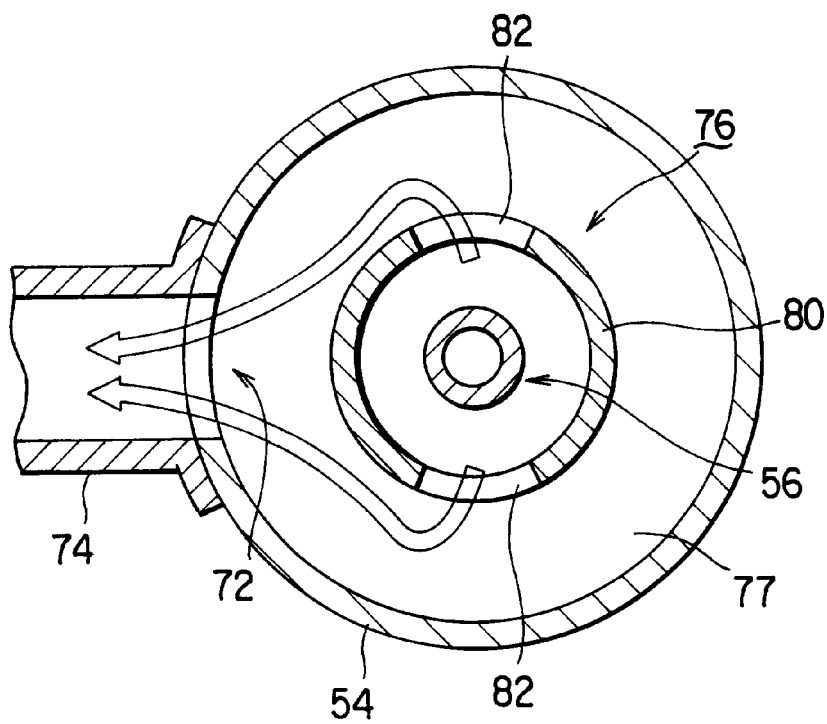
FIG. 2 is a sectional view taken along a line II—II in FIG. 1.

FIG. 1 is a sectional view showing a single-substrate-treating annealing apparatus according to an embodiment of the present invention. FIG. 2 is a sectional view taken along a line II—II in FIG. 1.

Figure 3:
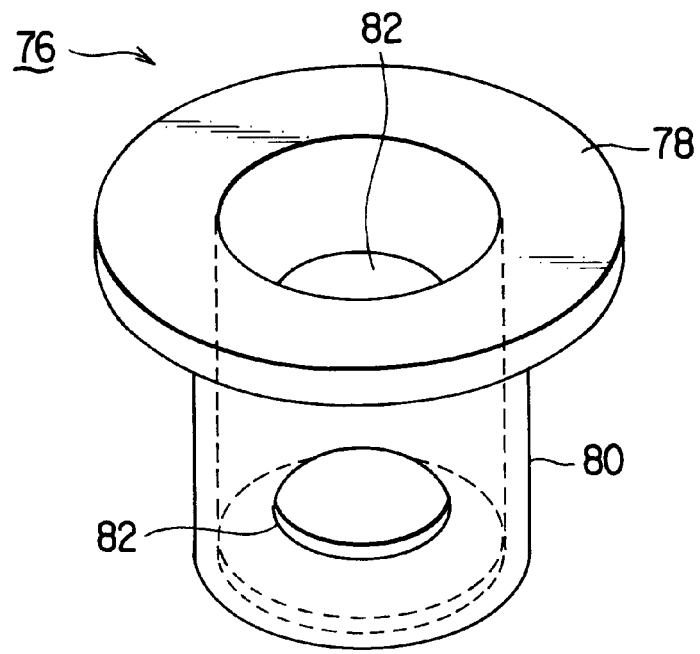
FIG. 3 is a perspective view showing a reducing tube disposed in an exhaust chamber.

FIG. 3 is a perspective view showing a reducing tube disposed in an exhaust chamber. In this embodiment, an annealing/modifying apparatus for processing an almost circular normal semiconductor wafer with an orientation flat will be described as a single-substrate-treating apparatus.

As shown in FIG. 1, an annealing/modifying apparatus has a process chamber 24 formed from aluminum and having, e.g., a substantially rectangular section. The process chamber 24 has, at its center, a work table 58 on which a semiconductor wafer W is placed. The work table 58 has a circular planar contour. The semiconductor wafer W is placed on the upper surface of the work table 58 to be concentrically with the surface. The work table 58 incorporates a heater 60 having a predetermined pattern.

The outer structure of the work table 58 is formed from a sintered ceramic such as AlN. A ring-shaped rectifying plate 86 is attached around the work table 58 and extends between the work table 58 and the inner wall of the process chamber 24. The rectifying plate 86 has a number of holes 84 so that an upper process space S communicates with a lower exhaust side (to be described later).

A plurality of pin holes 62 vertically extend through the work table 58. Push pins 64 made of, e.g., quartz and commonly coupled to a movable lever 66 are accommodated in these pin holes 62 in a loosely fitted state. The movable lever 66 is coupled to an reciprocating rod 68B of an air cylinder 68 provided on the lower surface of a bottom portion 48 of the process chamber 24 and causes the pusher pins 64 to extend upward from the upper ends of the pin holes 62 in transferring the wafer W. A bellows 70 is inserted between the air cylinder 68 and the lower surface of the bottom portion 48, so the reciprocating rod 68B can vertically move while maintaining the airtightness in the process chamber 24.

To introduce a process gas such as ozone into a process space S, a shower head 26 is disposed at the ceiling of the process chamber 24 to oppose the upper surface of the work table 58. The shower head 26 has a ring-shaped endless tube 26a and inside pipes 26b connected to the inside of the tube 26a and arranged to form a lattice, which are disposed concentrically with the circular planar contour of the work table 58. The endless tube 26a and inside pipes 26b, i.e., the shower head 26 has, on its lower surface, a number of spouting holes 28 equidistantly arranged for spouting the process gas. That is, the shower head 26 supplies the process gas concentrically with the planar contour of the work table 58 from positions of latticed arrangement. The shower head 26 supplies the process gas only from positions inside the planar contour of the work table 58. The process gas may be also supplied from positions outside the planar contour of the work table 58.

The process chamber 24 has a large opening at the ceiling. A transparent window 32 formed from, e.g., a quartz plate transparent to UV rays is hermetically attached to the opening portion 30 via a sealing member 34 such as an O-ring. A lamp chamber 38 covered with a casing 36 is formed above the transparent window 32. A plurality of UV lamps 40 are disposed in the lamp chamber 38. Ultraviolet rays UV emitted from the UV lamps 40 are introduced into the process space S through the transparent window 32.

The process chamber 24 has, on its sidewall, a loading/unloading gate 42 for loading/unloading the semiconductor wafer W as a target substrate into/from the process chamber 24. The loading/unloading gate 42 has a gate valve 44 that can be hermetically opened/closed.

An exhaust chamber 50 is connected to the bottom portion 48 of the process chamber 24 through a large circular opening 52 at the central portion of the bottom portion 48. The opening 52 has a planar contour smaller than that of the work table 58 (i.e., a diameter L1 of the opening 52 is set to be smaller than the diameter of the work table 58). The planar contours of the work table 58 and opening 52 are substantially concentric with each other. The internal space of the exhaust chamber 50 is also formed concentrically with the opening 52. A cylindrical wall 54 extending downward with a closed bottom is coupled to the opening 52, and the exhaust chamber 50 is formed therein.

A vertical strut 56 having, e.g., a cylindrical shape stands on a bottom portion 54A of the cylindrical wall 54. The center of the work table 58 is fixed to the upper end portion of the vertical strut 56. The vertical strut 56 concentrically extends through the opening 52. Feed lines 90 extend through the vertical strut 56 to supply power to the heater 60.

A reducing tube 76 disposed concentrically on the bottom portion 54A of the cylindrical wall 54 partitions the internal space of the exhaust chamber 50 into a primary space 51A and a restriction space 51B connected to the primary space 51A through a circular opening 55. More specifically, the diameter of the reducing tube 76 is set to be about ½ of the inner diameter of the cylindrical wall 54. The reducing tube 76 has, at its upper end portion, a ring-shaped flange portion 78 which has the same size as the inner diameter of the exhaust chamber 50 and is in contact with the cylindrical wall 54 (FIG. 3). That is, the inlet opening 55 of the reducing tube 76 has a planar contour smaller than that of the inlet opening 52 of the exhaust chamber 50, and the planar contours of the openings 52 and 55 are concentric with each other.

A main body portion 80 of the reducing tube 76 has sidewall openings 82 formed at two positions symmetric with respect to the center (FIG. 2). A buffer space 77 surrounding the reducing tube 76 and communicating with the sidewall openings 82 is formed between the reducing tube 76 and the cylindrical wall 54. The cylindrical wall 54 has an exhaust port 72 at the side portion. The exhaust port 72 is connected through an exhaust tube 74 to an exhaust system 75 including a vacuum pump for evacuating the process chamber 24.

The two sidewall openings 82 are located at equidistant positions from the exhaust port 72 such that they do not directly oppose the exhaust port 72. In the example shown in FIG. 2, the sidewall openings 82 are formed in directions offset by 90° with respect to the exhaust port 72. Hence, the process chamber can be uniformly evacuated from the two sidewall openings 82 without being nonuniformly evacuated from one of the sidewall openings 82.

The operation of this embodiment having the above arrangement will be described next.

The unprocessed semiconductor wafer W is held by a transfer arm (not shown) and loaded into the process chamber 24 through the open gate valve 44 and loading/unloading gate 42. The wafer W is received by the pusher pins 64 and then placed on the work table 58 as the pusher pins 64 moves downward.

The work table 58 is preheated to a predetermined temperature in advance. After the wafer W is placed, power supplied to the heater 60 is increased to heat the wafer W to a predetermined process temperature, and then the process temperature is maintained. A process gas, e.g., ozone is spouted and supplied from the shower head 26 into the process space S. At the same time, the vacuum pump (not shown) connected to the exhaust tube 74 is driven to evacuate the process chamber 24 and exhaust chamber 50, thereby maintaining predetermined process pressure in the process space S.

Simultaneously with the supply of the process gas, the UV lamps 40 provided above the ceiling are driven to irradiate the process gas and the surface of the wafer W with the ultraviolet rays UV through the transparent window 32. With this irradiation, ozone is excited to generate active oxygen atoms. The active oxygen atoms thus generated act on a thin film of, e.g., $TaO_x$ formed on the wafer W, to modify the film. With this process, the thin film on the wafer W is annealed/modified, and, if necessary, the film is then crystallized.

In the annealing/modifying apparatus 22, the exhaust chamber 50 is connected to the process chamber 24 through the opening 52 concentrically with the work table 58, and the process chamber 24 is evacuated through the exhaust chamber 50. In the above-described process, the process gas (ozone) supplied from the shower head 26 into the process space S almost uniformly flows to the peripheral portion of the wafer W, and biased flow rarely occurs. Hence, the planar uniformity of processing, i.e., the planar uniformity of annealing/modification can be maintained high.

More specifically, in the annealing/modifying apparatus 22, the process gas spouted from the shower head 26 almost uniformly flows and spreads outward in the radial direction from the center on the upper surface of the wafer, unlike the conventional apparatus shown in FIGS. 6 and 7. In addition, the process gas almost uniformly passes through the holes 84 of the rectifying plate 86 around the work table 58 and flows into the lower side of the work table 58. The process gas then flows into the exhaust chamber 50 through the opening 52 and flows through the exhaust chamber 50 downward. The process gas flows out from the central portion of the reducing tube 76 through the sidewall openings 82 and is finally exhausted from the exhaust tube 74 through the exhaust port 72.

In this way, since the process gas flows into the lower side of the work table 58 through the entire peripheral edge of the work table 58, the process gas can be uniformly flowed without generating biased flow on the wafer. For this reason, high planar uniformity of processing such as annealing/modification can be maintained. This effect is obtained by making the planar contour of the inlet opening 52 of the exhaust chamber 50 smaller than that of the work table 58 and disposing them almost concentrically with each other. To obtain a sufficient effect, the ratio of the planar contour area of the opening 52 to that of the work table 58 is preferably set to be 90 to 25% and, more preferably, 75 to 45%.

Additionally, as shown in FIG. 2, the two sidewall openings 82 are located at equidistant positions from the exhaust port 72 and do not directly oppose it. For this reason, the process gas can be almost uniformly exhausted from the two sidewall openings 82 without being nonuniformly exhausted from one sidewall opening 82. From this viewpoint as well, the distribution of the gas flowing into the opening 52 of the exhaust chamber 50 becomes uniform, and the process gas flowing on the wafer can be further uniformed.

The conventional apparatus requires the four exhaust tubes 20 (FIG. 6). However, in this embodiment, one exhaust tube 74 suffices. For this reason, the maintenance can be facilitated because the exhaust structure is simplified, and the space portion increases.

Figure 4:
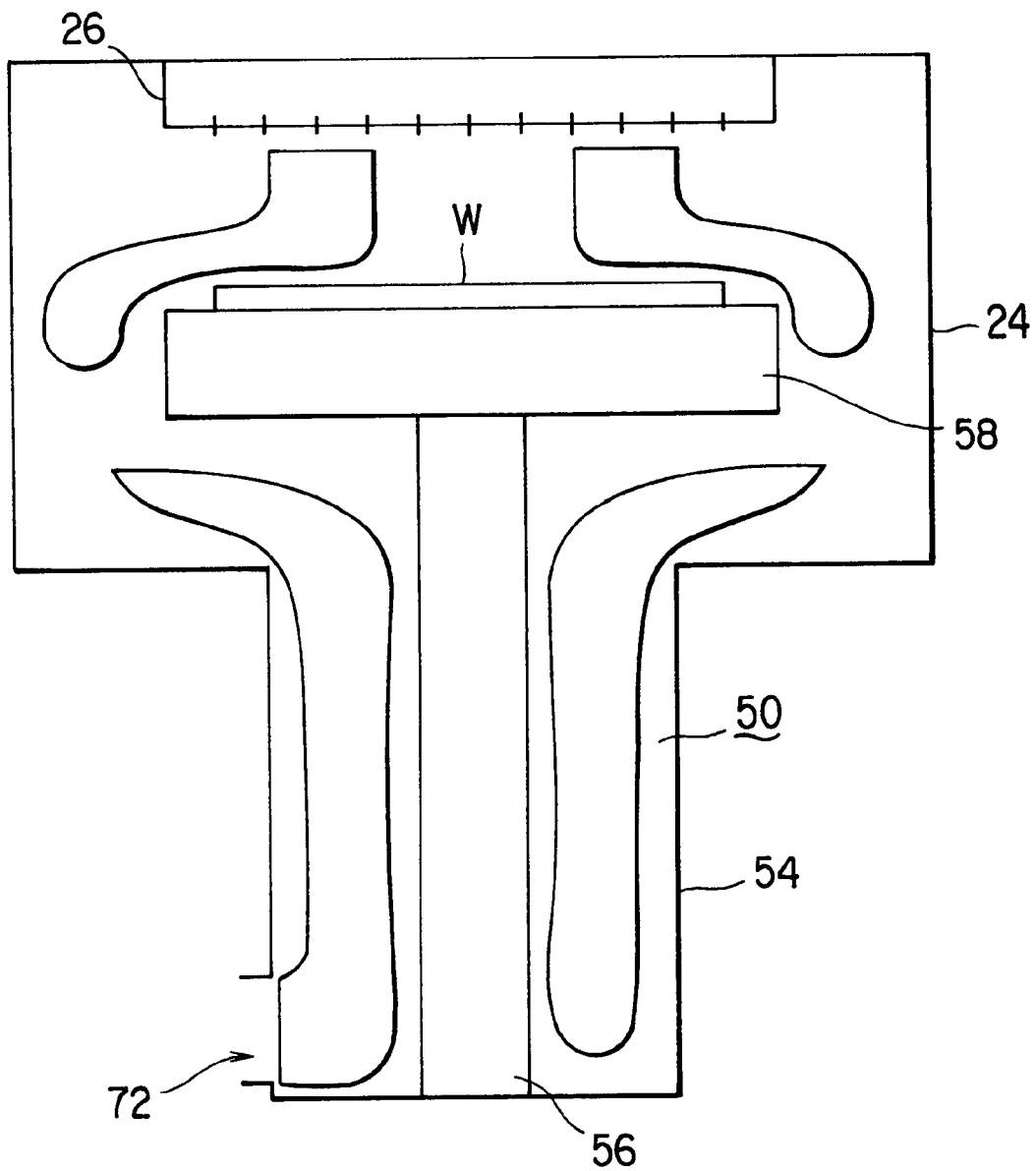
FIG. 4 is a view showing a simulation result of the process gas flow in a process chamber and exhaust chamber of the apparatus shown in FIG. 1.

FIG. 4 is a view showing a simulation result of the process gas flow in the process chamber 24 and exhaust chamber 50. As is apparent from FIG. 4, in the apparatus of the present invention, the process gas almost uniformly flows from almost the central side to the peripheral portion of the wafer surface, and the gas rarely stays, unlike the conventional apparatus shown in FIG. 8.

The diameter of the reducing tube 76 and the number of sidewall openings 82 formed in the reducing tube 76 are merely examples, and the present invention is not limited to these examples described above. Almost the same effect as described above can be obtained even when the reducing tube 76 is omitted.

An annealing/modifying apparatus has been described above as an example of a processing apparatus. However, the present invention can also be applied to a film formation apparatus, etching apparatus, oxidization/diffusion apparatus, and processing apparatus using a plasma.

Figure 5:
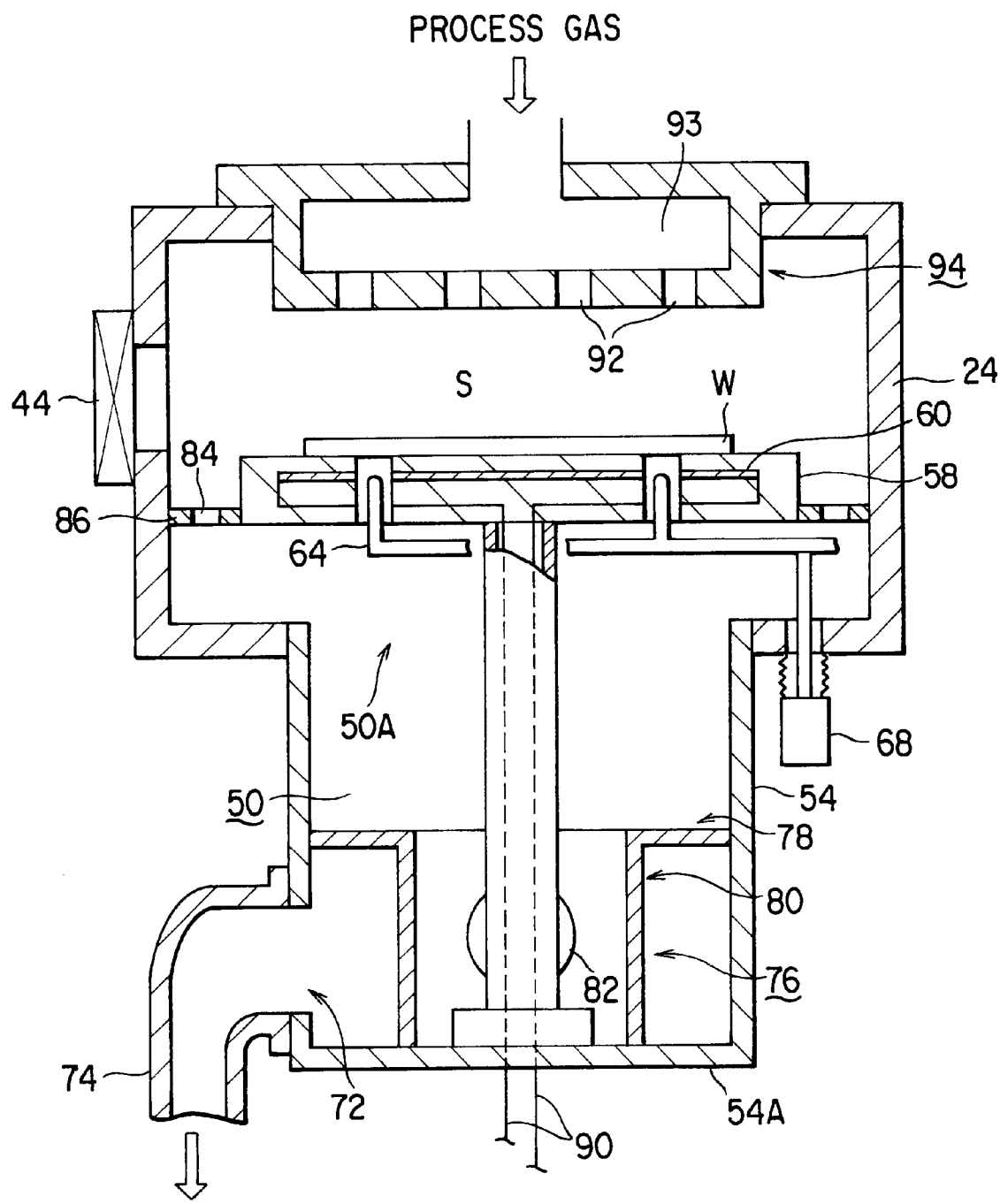
FIG. 5 is a sectional view showing a single-substrate-treating CVD apparatus according to another embodiment of the present invention.

FIG. 5 is a sectional view showing a single-substrate-treating CVD apparatus according to another embodiment of the present invention. In this apparatus, the process gas contains a material for forming a thin film on a semiconductor wafer W.

In this apparatus, the UV lamps 40 and transparent window 32 are removed from the apparatus shown in FIG. 1. In addition, a normal shower head 94 constructed by a hollow housing is used in place of the ring-and-lattice shower head 26. More specifically, the shower head 94 has a lower surface which has spouting holes 92 for spouting a process gas and is formed almost concentrically with the planar contour of a work table 58, and a stay space 93 communicating with the spouting holes 92. The shower head 94 supplies the process gas only from positions inside the planar contour of the work table 58. The process gas may be also supplied from positions outside the planar contour of the work table 58.

Figure 9:
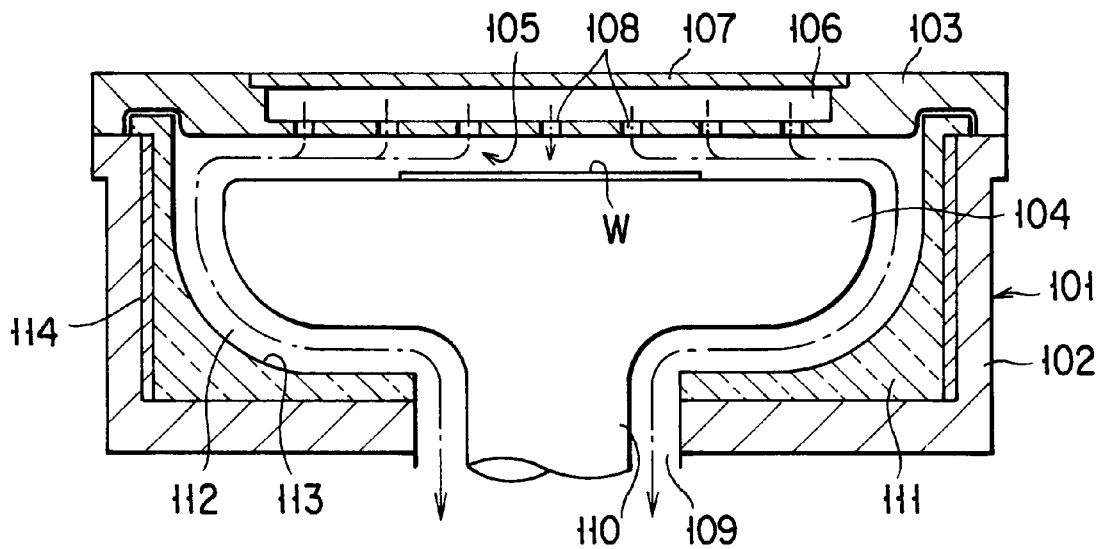
FIG. 9 is a sectional view showing a single-substrate-treating CVD apparatus according to still another embodiment of the present invention.

FIG. 9 is a sectional view showing a single-substrate-treating CVD apparatus according to still another embodiment of the present invention. This CVD apparatus includes a closed process chamber 101 surrounded by a metal housing (outer vessel) 102 having a box- or vessel-shape and opened at its upper portion, and a lid 103 for closing the upper opening. The process chamber 101 has a susceptor (work table) 104, on which a target substrate such as the semiconductor wafer W is placed and heated. The process chamber 101 has, on its sidewall, an inlet/outlet through which the wafer W is loaded/unloaded. A transfer chamber (not shown) having a transfer arm for transferring the wafer W is coupled to the inlet/outlet via a gate valve.

In the lid 103, a shower head 105 for spouting and supplying a process gas is disposed to oppose the upper surface of the susceptor 104 or the wafer W on the susceptor 104. The shower head 105 uses, as a gas stay space, a large circular recessed portion 106 formed at the center of the lid 103 and sufficiently larger than the diameter of the wafer W. The upper portion of the recessed portion 106 is closed by an upper plate 107. A number of gas spouting holes 108 are formed at the bottom portion of the recessed portion 106. The lower surface of the shower head 105 is preferably formed to be flush with the lower surface of the lid 103 to prevent the process gas from staying or stagnating around the shower head 105.

A process gas supply tube (not shown) for supplying the process gas to the shower head 105 is connected to the upper plate 107. An appropriate number of porous plates (not shown) for uniformly distributing the process gas are preferably attached in the recessed portion 106.

On the bottom portion side of the process chamber 101, and in the example shown in FIG. 9, at the bottom portion, an exhaust port 109 for decompressing and evacuating the process chamber 101 is disposed. An exhaust system (not shown) having a vacuum pump or pressure control mechanism capable of decompressing the process chamber 101 to predetermined pressure, e.g., several Torr is connected to the exhaust port 109. In the example shown in FIG. 9, the susceptor 104 has an upper surface with a circular flat shape sufficiently larger than the diameter of the wafer W and has a neck portion 110 having a smaller diameter on the lower side.

The susceptor 104 is formed from, e.g., silicon carbide (SiC) and incorporates, on the upper side, a heating element, e.g., a ceramic heater, so the wafer W can be uniformly heated along its plane. The neck portion 110 of the susceptor 104 extends through the bottom portion of the process chamber 101 and is supported by a support portion (not shown) outside the process chamber. The elevating mechanism or rotating mechanism for the susceptor 104 may be connected to the neck portion of the susceptor 104. The exhaust port 109 is formed to surround the neck portion 110 at the portion where the neck portion 110 extends through the bottom portion.

The inner surface of the process chamber 101 is preferably formed from quartz to prevent corrosion by a cleaning gas and metal contamination of the wafer W. Since the metal housing 102 of the process chamber 101 and the lid 103 including the shower head 105 are formed from normal aluminum, a cover member (inner vessel) 111 of quartz is disposed to cover the inner surface of the metal housing 102. The cover member 111 is formed from quartz into a vessel shape covering the inner surface of the metal housing 102.

An annular exhaust path 112 communicating with the exhaust port 109 is formed between the cover member 111 and the susceptor 104. The lower corner portion of the process chamber 101 preferably has a streamline form (curve) 113 to smoothly exhaust the process gas without making it stay. For this reason, the inner corner portion of the cover member 111 has the streamline form or curve 113. The outer surface of the susceptor 104 also preferably has a streamline form or curve conforming to the inner surface of the cover member 111.

At least portions of the shower head 105 and lid 103, which come into contact with the process gas, i.e., in the example shown in FIG. 9, the inner surface of the lid 103 and the inner surface of the shower head 105 (inner surfaces of the recessed portion 106 and upper plate 107) are preferably formed from or covered with quartz (not shown) to prevent corrosion by a cleaning gas or metal contamination of the semiconductor wafer.

To suppress sticking of a reaction by-product due to coagulation of the process gas components, the process chamber 101 has a heating means, e.g., a resistance heating element 114 for heating the inner surface of the process chamber 101. The resistance heating element 114 is preferably disposed between the housing 102 and the cover member 111.

According to the single-substrate-treating apparatus shown in FIG. 9, since at least the inner surface of the process chamber 101 is formed from quartz, corrosion of the inner surface of the process chamber 101 by the cleaning gas can be prevented, and metal contamination of the wafer W by contained metal (e.g., copper) due to corrosion of aluminum can be prevented.

In addition, since the lower corner portion of the process chamber 101 has the streamline form 113, stay of the process gas can be suppressed. Hence, sticking or deposition of the reaction by-product due to stay of the process gas can be suppressed, and particle contamination of the wafer W due to peel-off and scattering of the reaction by-product can be prevented. Furthermore, since the heating means 114 is disposed in the process chamber 101, sticking of the reaction by-product due to coagulation of the process gas component can be suppressed, and particle contamination of the wafer W can be prevented. In addition, since at least a portion of the shower head 105, which comes into contact with the process gas, is formed from quartz, corrosion by the cleaning gas can be prevented, and metal contamination of the semiconductor wafer due to corrosion can be prevented.

Figure 10:
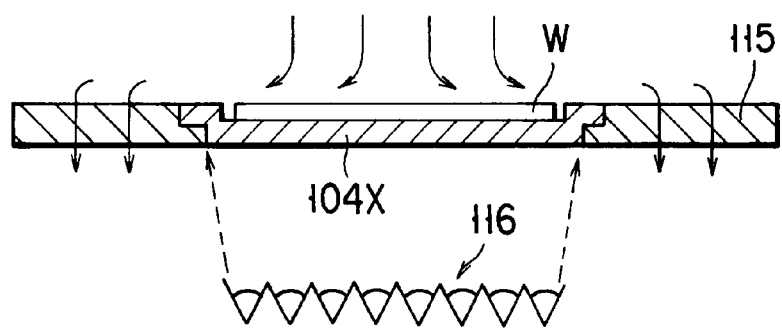
FIG. 10 is a sectional view showing a modification of a susceptor.

FIG. 10 is a sectional view showing a modification of the susceptor. A dish-like susceptor 104X is made of, e.g., silicon carbide (SiC) or aluminum nitride (AlN). An annular rectifying plate 115 of, e.g., alumina ($Al_2O_3$) is attached around the susceptor 104X. The susceptor 104X is heated from the lower side by a heating lamp 116, so the wafer W can be uniformly heated along its plane. The rectifying plate 115 has a number of vent holes (not shown) to obtain a uniform gas flow. When the susceptor 104X is used, the heating temperature and gas flow can be made uniform (isotropic). Hence, the uniformity of film thickness in CVD can be improved.

Figure 11:
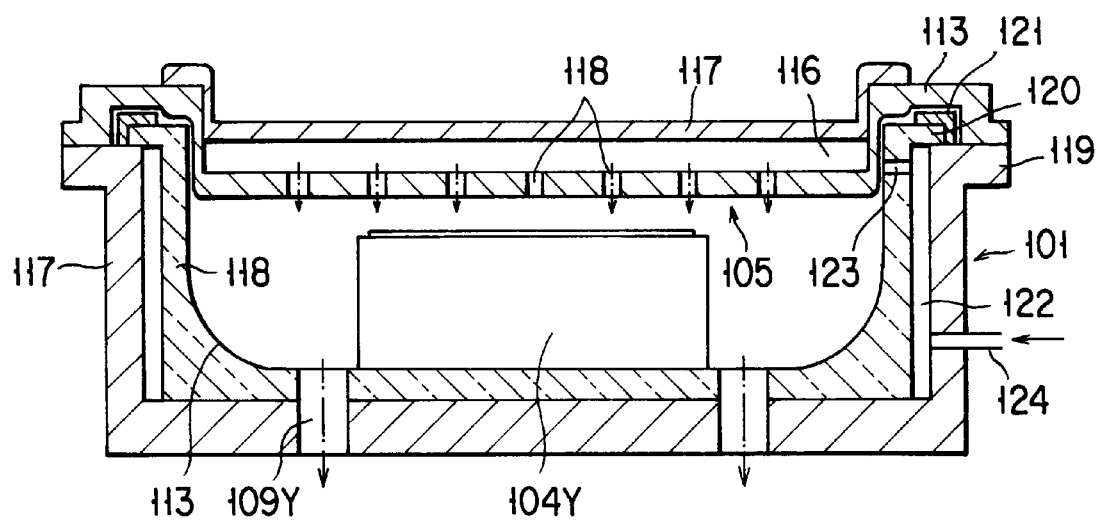
FIG. 11 is a sectional view showing a single-substrate-treating CVD apparatus according to still another embodiment of the present invention.

FIG. 11 is a sectional view showing a single-substrate-treating CVD apparatus according to still another embodiment of the present invention.

In this CVD apparatus, a process chamber 101 includes an outer vessel 117 made of a metal, e.g., aluminum and an inner vessel 118 made of quartz and accommodated inside the outer vessel 117. A process space is formed in the inner vessel 118. The outer vessel 117 has a box-like shape with a closed bottom and an open upper portion, like the housing 102 shown in FIG. 9. The inner vessel 118 also has a box-like shape with a closed bottom and an open upper portion, like the outer vessel 117.

The inner vessel 118 is placed on the bottom of the outer vessel 117. Flanges 119 and 120 extending outward are formed at the upper edge portions of the outer vessel 117 and inner vessel 118, respectively. The flange 120 of the inner vessel 118 is placed on the flange 119 of the outer vessel 117. The flange 120 of the outer vessel 117 is fixed on the flange 119 of the outer vessel 117 by a flange holding member 121.

A susceptor 104Y is set on the bottom portion of the inner vessel 118. An exhaust port 109Y extending through the inner vessel 118 and outer vessel 117 is formed at the bottom portions of the inner vessel 118 and outer vessel 117. An exhaust system (not shown) is connected to the exhaust port 109Y. The lower corner portion of the inner vessel 118 is formed to have a streamline form or curve 113 such that the process gas can smoothly flow.

A gap 122 is formed between the side wall of the outer vessel 117 and that of the inner vessel 118. A communication hole 123 is formed on the upper side of the side wall of the inner vessel 118. This structure functions as a pressure balance means for balancing internal and external pressures of the inner vessel 118. In this case, a reaction by-product must be suppressed from sticking when the process gas enters the gap 122 from the inner vessel 118 through the communication hole 123. For this purpose, an inert gas supply tube 124 for supplying an inert gas such as nitrogen gas into the gap 122 to dilute the process gas that has entered is connected to the outer vessel 117.

According to the single-substrate-treating apparatus shown in FIG. 11, since the pressure balance means for balancing the internal and external pressures of the inner vessel 118 is disposed, damage to the inner vessel 118 of quartz due to the difference between the internal and external pressures of the inner vessel 118 can be prevented. In addition, since the actual process chamber is formed by the inner vessel 118 of quartz, corrosion by the cleaning gas can be prevented, and metal contamination of the wafer W can be prevented. In the apparatus shown in FIG. 11, the susceptor 104 and exhaust port 109 shown in FIG. 9 may be used in place of the susceptor 104Y and exhaust port 109Y.

Figure 12:
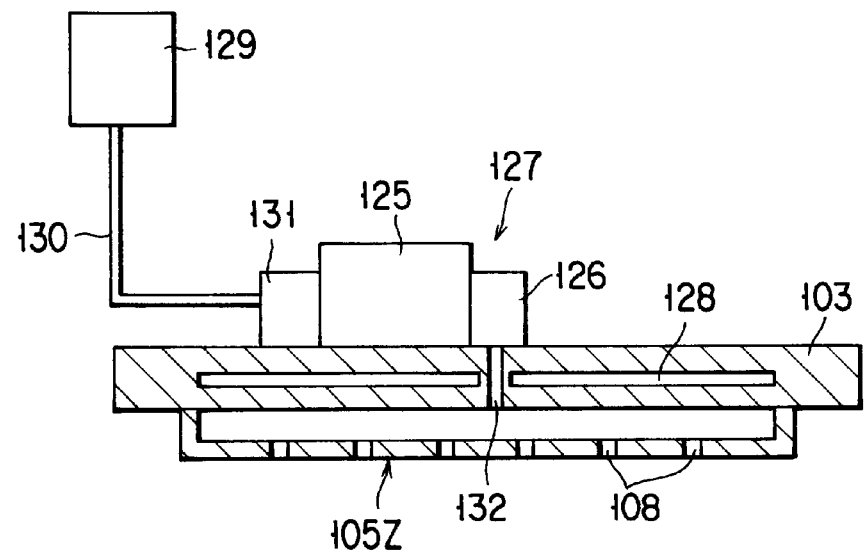
FIG. 12 is a sectional view showing a modification of a shower head.

FIG. 12 is a sectional view showing a modification of the shower head. A gas supply system 127 as a gas source including a liquid material vaporizer 125 and flow control valve 126 is disposed on a shower head 105Z. That is, the gas supply system 127 is disposed on the lid 103 of the process chamber 101.

The lid 103 preferably has a heating means 128 for heating the stay space in the shower head 105Z to prevent liquefaction or coagulation of the process gas. As the heating means 128, a resistance heating element can be used. Alternatively, a means for circulating a thermal medium (liquid) to manage temperature may be used.

The gas supply system 127 has an inlet valve 131 for introducing a liquid material such as tantalum oxide ($Ta_2O_5$) from a material supply portion 129 through a pipe 130. To vaporize the liquid material introduced through the inlet valve 131, the vaporizer 125 is disposed. To control the flow rate of the process gas supplied from the vaporizer 125, the outlet valve (flow control valve) 126 is disposed. The inlet valve 131 and outlet valve 126 are also connected through a bypass (not shown; formed in, e.g., the lid 103) parallel to the vaporizer 125. The process gas is supplied from the flow control valve 126 into the shower head 105Z through a gas path 132 formed in the lid 103. A plurality of gas supply systems 127 are provided in accordance with the gas species. These gas supply systems 127 are preferably covered with a cover.

According to the single-substrate-treating apparatus shown in FIG. 12, the gas supply system 127 including the liquid material vaporizer 125 and flow control valve 126 is disposed near the shower head 105Z. This structure shortens the gas piping and makes the apparatus compact. In addition, the response of gas supply is improved, and the film thickness and quality in film formation can be improved.

For the single-substrate-treating apparatus of the present invention, the following changes can further be made.

An air curtain of an inert gas may be provided at the inlet/outlet of the process chamber to prevent dust from entering the chamber. To suppress sticking of the reaction by-product to the gate valve provided at the inlet/outlet of the process chamber, the temperature of the gate valve may be controlled using a thermal medium (liquid). To suppress sticking of the reaction by-product, the temperature of the entire process chamber or exhaust system may be controlled by a thermal medium (liquid) or electronic thermal function such as the Seebeck effect. In addition, as a measure against dew condensation in the transfer chamber or cassette chamber on the platform side, the temperature of the chamber may be controlled.

As the pipe (exhaust tube) of the exhaust system, glass lining tube is preferably used to prevent metal contamination of the target substrate. At least a portion of the shower head, which comes into contact with the process gas, is preferably formed from quartz to prevent metal contamination of the target substrate. However, that portion may be formed from pure aluminum.

In this embodiment, a semiconductor wafer has been exemplified as a target substrate. However, the present invention can also be applied to an LCD substrate or glass substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A single-substrate-treating apparatus for a semiconductor processing system, comprising:

a hermetic process chamber;

a work table disposed in the process chamber and having an upper surface on which a target substrate is placed;

a supply mechanism configured to supply a process gas into the process chamber from a position opposing the upper surface of the work table;

an exhaust chamber connected to a bottom portion of the process chamber through a first opening below the work table, the first opening and the exhaust chamber having contours smaller than that of the work table, and the contours of the work table, the first opening, and the exhaust chamber being arranged substantially concentrically with each other;

a partition flange disposed in the exhaust chamber, and defining a primary space in an upper side of the exhaust chamber, the primary space directly communicating with the exhaust chamber through the first opening, the partition flange having a second opening, which has a contour smaller than that of the first opening, and the contours of the first and second openings being arranged substantially concentrically with each other;

a partition sidewall disposed in the exhaust chamber, and defining a restriction space at a center and a buffer space surrounding the restriction space in a lower side of the exhaust chamber, the restriction space directly communicating with the primary space through the second opening, and the buffer space directly communicating with the restriction space through a plurality of sidewall openings formed at symmetrical positions of the partition sidewall, without directly communicating with the primary space; and an exhaust mechanism connected to the buffer space through an exhaust port, which is formed in a wall of the exhaust chamber and opened to the buffer space, the exhaust mechanism being configured to exhaust the process chamber, and the sidewall openings being located at equidistant positions from the exhaust port.

2. The apparatus according to claim 1, wherein the work table is supported by a vertical strut connected to a substantial center of the work table, the vertical strut concentrically extending through the first opening, the primary space, the second opening, and the restriction space.

3. The apparatus according to claim 1, wherein a ratio of an area of the contour of the first opening to an area of the contour of the work table is 90 to 25%.

4. The apparatus according to claim 1, wherein the contours of the work table, the first opening, the exhaust chamber, the second opening, and the partition sidewall substantially have a circular shape.

5. The apparatus according to claim 1, wherein the exhaust port is formed in a sidewall of the exhaust chamber.

6. The apparatus according to claim 5, wherein the number of the sidewall openings formed in the partition sidewall is two, and the sidewall openings are formed in directions offset by 90° with respect to the exhaust port.

7. The apparatus according to claim 1, wherein the supply mechanism comprises a shower head disposed in the process chamber to oppose the upper surface of the work table and supply the process gas.

8. The apparatus according to claim 7, wherein the target substrate is placed concentrically with the contour of the work table, and the shower head supplies the process gas concentrically with the contour of the work table.

9. The apparatus according to claim 8, wherein the shower head supplies the process gas only from positions inside the contour of the work table.

10. The apparatus according to claim 8, wherein the shower head has a ring-shaped tube arranged substantially concentrically with the contour of the work table, the tube having spouting holes for spouting the process gas.

11. The apparatus according to claim 8, wherein the shower head comprises a hollow housing having a lower surface in which spouting holes for spouting the process gas are formed substantially concentrically with the contour of the work table, and a space communicating with the spouting holes in which the process gas temporarily circulates prior to exiting through the spouting holes.

* * * * *